(12) United States Patent
Hu

(10) Patent No.: US 11,755,043 B2
(45) Date of Patent: Sep. 12, 2023

(54) BIOLOGICALLY TEMPERATURE-CONTROLLED ELECTRONICS SHELL COMPONENT

(71) Applicant: Wen-Sung Hu, Tainan (TW)

(72) Inventor: Wen-Sung Hu, Tainan (TW)

( * ) Notice: Subject to any disclaimer, the term of this patent is extended or adjusted under 35 U.S.C. 154(b) by 60 days.

(21) Appl. No.: 17/156,842

(22) Filed: Jan. 25, 2021

(65) Prior Publication Data

US 2022/0236752 A1    Jul. 28, 2022

(51) Int. Cl.
*H05K 5/00* (2006.01)
*G05D 23/27* (2006.01)
*H05K 7/20* (2006.01)
*G06F 1/20* (2006.01)
*H05K 5/02* (2006.01)

(52) U.S. Cl.
CPC ............ *G05D 23/27* (2013.01); *G06F 1/206* (2013.01); *H05K 5/0004* (2013.01); *H05K 5/0086* (2013.01); *H05K 5/0217* (2013.01); *H05K 7/20836* (2013.01)

(58) Field of Classification Search
CPC ...... G05D 23/27; G06F 1/206; H05K 5/0004; H05K 5/0086; H05K 5/00217; H05K 7/20836
See application file for complete search history.

(56) References Cited

U.S. PATENT DOCUMENTS

| 8,567,032 | B2 * | 10/2013 | de Traglia Amancio Filho .......... B23K 20/129 29/283.5 |
| 9,925,717 | B2 * | 3/2018 | De Traglia Amancio Filho ......... B29C 66/545 |
| 10,631,420 | B1 * | 4/2020 | Xiong ...................... H05K 5/04 |
| 2011/0131784 | A1 * | 6/2011 | de Traglia Amancio Filho .......... B29C 66/21 29/428 |
| 2012/0153549 | A1 * | 6/2012 | Milagres Ferri ...... B29C 65/562 264/645 |
| 2015/0216081 | A1 | 7/2015 | Huang |
| 2016/0094263 | A1 * | 3/2016 | Fathollahi ........... B29C 45/1671 455/575.8 |
| 2016/0297138 | A1 * | 10/2016 | De Traglia Amancio Filho .......... B29C 65/081 |
| 2018/0332150 | A1 * | 11/2018 | Subba ................. H04M 1/0249 |

FOREIGN PATENT DOCUMENTS

CN         205491590 U   *   8/2016

* cited by examiner

*Primary Examiner* — Abhishek M Rathod
*Assistant Examiner* — Keith DePew
(74) *Attorney, Agent, or Firm* — Karin L. Williams; Alan D. Kamrath; Mayer & Williams PC

(57) ABSTRACT

A biologically temperature-controlled electronics shell component is adapted to constitute an outer shell and/or a middle shell of an electronic product such as a mobile phone, a tablet device, a laptop computer a wearable device, and the like. A heat source is provided in the electronic product. The shell component includes an outer shell body and an outer heat-conducting sheet. The outer shell body includes at least one hole extending through inner and outer surfaces thereof. The outer heat-conducting sheet corresponding to the heat source and combined with the outer shell body includes a heat-conducting portion corresponding to the hole. Radiant heat generated by the heat source can be absorbed by and dissipated through the outer heat-conducting sheet and conducted through a user's skin which is contacting the heat-conducting portion.

7 Claims, 21 Drawing Sheets

BIOLOGICALLY TEMPERATURE-CONTROLLED ELECTRONICS SHELL COMPONENT

BACKGROUND OF THE INVENTION

1. Field of the Invention

The present invention relates to a shell component and, more particularly, to an electronics shell component with biological temperature control and heat exchange functions.

2. Description of the Related Art

The advanced semiconductor technologies are credited with exquisite electronics such as mobile phones and tablet devices characteristic of ultrathin appearances, diversified functions and dazzling capacities for activations of APPs. Moreover, the broadband speed is crucial to internet users increasingly. However, the issue of how to effectively dissipate heat derived from operational semiconductor components (for example, CPU) for smooth running of a semiconductor-based device is critically important.

As an electronic substrate installed inside ordinary electronics (for example, mobile phone, tablet device, laptop computer and desktop computer), a printed circuit board features its top and back sides, coated and sealed, to prevent circuits from moisture-induced oxidation that works against operations of semiconductor components. However, heat derived from an operational semiconductor component must be sustained by the semiconductor component itself rather than dissipated from the coated and sealed PCB. Accordingly, some manufacturers install heat dissipation films on the top edges of the semiconductor components to dissipate heat, or some manufacturers install radiant heat absorbers, condenser pipes, thermal conduction rods or heat pipes around heat sources of the semiconductor components and extend the condenser pipes, the thermal conduction rods or the heat pipes to low-temperature regions in the device bodies, so that the heat from the semiconductor components can be uniformly distributed. Furthermore, an alloy case installed over a high-end mobile phone is meant to further conduct thermal radiation inside the mobile phone.

The trend of electronics is to emphasize a portable product with a compact size. A thinner electronic product (especially a mobile phone or a tablet device) should accommodate cooling parts scaled down to ultrathin sizes. However, heat conduction based on scaled-down cooling parts is ineffective and results in poor efficiency of heat dissipation. Moreover, a mobile phone or a tablet device provided with a sealed substrate and semiconductor components thereon features the airtight space inside a device body in which cross-ventilation is extremely limited and dramatically rising thermal radiation is almost unsolved. Specifically, heat accumulation common in a mobile phone or a tablet device has negative effects on the operational device, such as hot shutdown, hot failure of a semiconductor chip, device body burning hot and battery overheated or damaged. For a high-end mobile phone equipped with a metal case and abovementioned cooling parts, the semiconductor component mostly encapsulated in an airtight space bears the brunt of poor heat dissipation that works against moderation of heat accumulation at the operational semiconductor component in the sealed airtight space. Particularly, the chips of a 5G mobile phone consumes 2.5 times as much electric power as those of a 4G mobile phone, according to statistic data, worsening heat accumulation that will increase exponentially. Furthermore, a middle shell body is installed inside the device body of a high-end mobile phone from which more heat is generated by operational semiconductor components and used to prevent a user from scalds attributed to heat conducted by the outer shell body directly. However, the functions of the mobile phone are seriously affected because the middle shell body on which no heat conductor is mounted makes no contribution to dissipation of heat accumulated inside.

Document US20150216081A1 discloses a heat dissipation mechanism for handhold electronic apparatus, which comprises a thin metal sheet and at least one heat pipe joined to the thin metal sheet. The heat dissipation mechanism is designed to enhance the heat dissipation performance of the handheld electronic apparatus, avoiding damage to the handheld electronic apparatus or its components. The document does, however, not provide a satisfactory solution of the above mentioned problems.

BRIEF SUMMARY OF THE INVENTION

Therefore, it is an objective of the present invention to overcome the aforementioned shortcoming and deficiency of the prior art by providing a biologically temperature-controlled electronics shell component which serves as the outer shell as well as the middle shell in different types of mobile phones, tablet devices or wearable devices and contributes to fast conduction of radiant heat accumulation from heat sources (for example, semiconductor components) inside the device body of electronics through the shell component to outside for effective temperature control and normal operations of the semiconductor components.

The biologically temperature-controlled electronics shell component of the present invention includes an outer shell body and an outer heat-conducting sheet. The outer shell body is adapted to be combined with a device body of an electronic product, and the device body has a heat source therein. The outer shell body includes opposite inner and outer surfaces and at least one hole penetrating the inner and outer surfaces. The outer heat-conducting sheet is combined with the outer shell body and includes opposite inner and outer end faces and at least one heat-conducting portion. The inner end face of the outer heat-conducting sheet faces the heat source of the electronic product. The at least one heat-conducting portion corresponds to the at least one hole in the outer shell body, so that the heat-conducting portion can be contacted by a user through the hole. The outer heat-conducting sheet further includes a periphery surrounding the heat-conducting portion and combined with the outer shell body.

In an embodiment, the electronic product is one of a mobile phone, a tablet device, a laptop computer, a WiFi relay unit, a LED lamp, a solar power connection box, a solar inverter and a wearable device. The outer shell body is made of a plastic material, the outer heat-conducting sheet is made of a metal material, and the heat-conducting portion is composed of a convex portion protruding outward from the outer end face and embedded in the hole of the outer shell body.

In an embodiment, the heat-conducting portion is composed of a convex portion protruding outward from the inner end face.

In a preferred form, the outer heat-conducting sheet is provided with a plurality of pinholes in which plastic is injected such that the periphery of the outer heat-conducting sheet is encased in the outer shell body for integral combination.

In a preferred form, the periphery of the outer heat-conducting sheet is provided with a flange, and the outer end face of the outer heat-conducting sheet is provided with a plurality of sharpened convex granules. The flange and the convex granules of the outer heat-conducting sheet are fused with the outer shell body such that the outer heat-conducting sheet is fused with the inner surface of the outer shell body.

In an embodiment, the at least one hole includes a plurality of holes and is arranged adjacent to sides of the outer shell body. The periphery of the outer heat-conducting sheet extends to a circumference of the inner surface of the outer shell body.

In an embodiment, the electronics shell component further comprises a middle shell body and an inner heat-conducting sheet. The middle shell body is installed in the device body of the electronic product and includes opposite inner and outer surfaces and a hole penetrating the inner and outer surfaces. The inner heat-conducting sheet is combined with the middle shell body and corresponds to the heat source. The inner heat-conducting sheet is located between the outer heat-conducting sheet and the heat source and includes a heat-conducting portion corresponding to the hole of the middle shell body. The inner heat-conducting sheet further includes a periphery surrounding the heat-conducting portion of the inner heat-conducting sheet and engaged with the middle shell body.

In practice of the shell component of the present invention, an outer shell (or an outer shell and a middle shell) of an existing electronic product (for example, mobile phone, tablet device, laptop computer, WiFi router, WiFi outdoor relay unit, solar power connection box, inverter, LED bulb, projector lamp, etc.) can be substituted by the shell component having the identical model or size without any modification inside the existing electronic product in structure for effective conduction of radiant heat from the device body to outside and fast heat conduction and dissipation effects. Specifically, the heat-conducting sheet on the shell component quickly absorbs radiant heat generated by a heat source inside the electronic product and radiant heat is dissipated outward from the device body through the heat-conducting portion for moderate heat accumulation of semiconductor components operating in an airtight space. Moreover, radiant heat generated by the heat source is quickly conducted through the heat-conducting portion contacted by a user's skin (fingers also) for heat conduction and dissipation by biological temperature control of the human body. Furthermore, the shell component of the present invention is applicable to an electronic product (for example, mobile phone or a wearable/smart device) which will be shut down for protecting a battery in low-temperature status. With a heat conduction sheet contacted by fingers or skin, heat from body temperature is conducted by the heat conduction sheet and radiated into the device body for higher temperature inside an airtight space and no shutdown in case of the battery at low-temperature status.

The present invention will become clearer in light of the following detailed description of illustrative embodiments of this invention described in connection with the drawings.

DESCRIPTION OF THE DRAWINGS

The illustrative embodiments may best be described by reference to the accompanying drawings where.

DETAILED DESCRIPTION OF THE INVENTION

Figure 1:
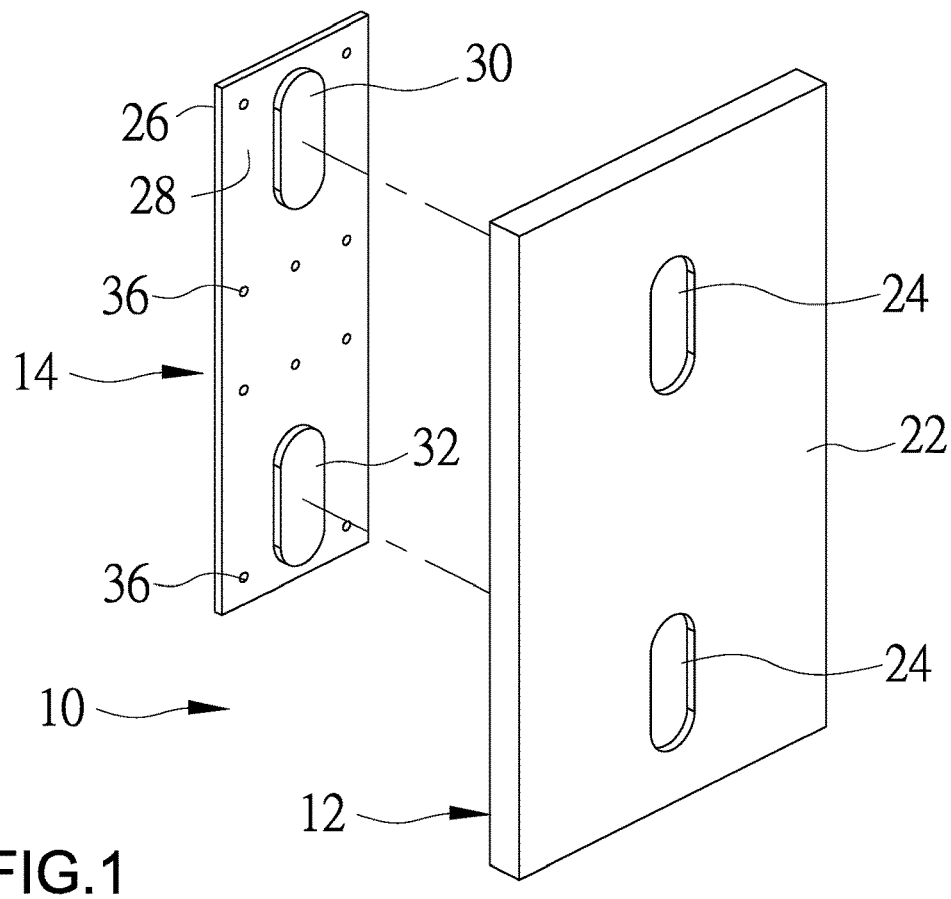
FIG. 1 is an exploded view of an electronics shell component according to a first embodiment of the present invention.
Figure 2:
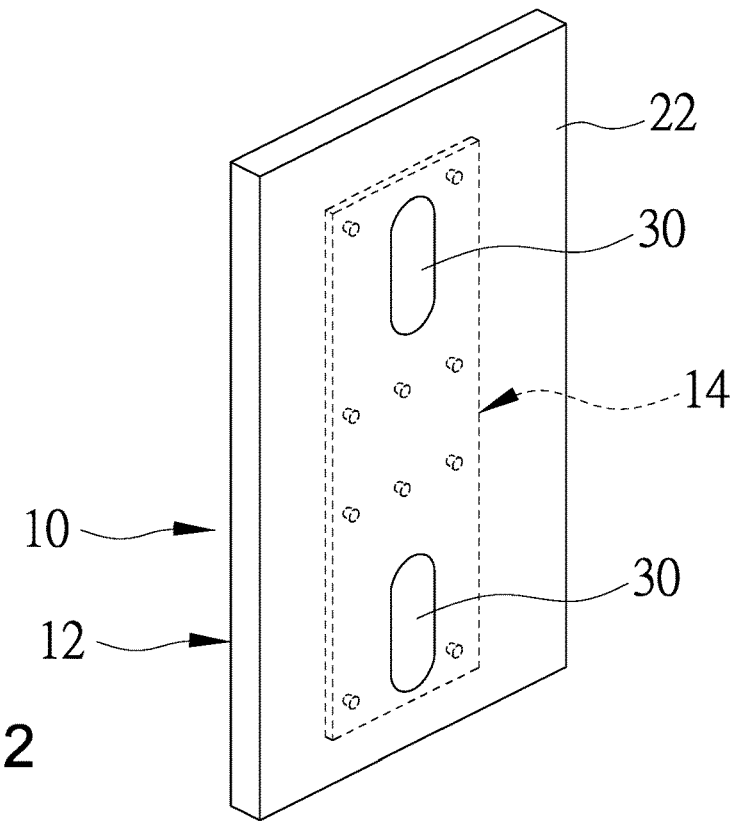
FIG. 2 is a perspective view of the shell component of FIG. 1.

A biologically temperature-controlled electronics shell component 10 of a first embodiment of the present invention is shown FIGS. 1 through 4 of the drawings. The biologically temperature-controlled electronics shell component 10 according to the present invention is applicable to electronic products such as mobile phones, tablet devices, laptop computers, WiFi (Wireless-Fidelity) routers, projectors, mini-cameras, LED (Light-emitting diode) lamps, solar power connection boxes, solar inverters and wearable devices (for example, smart watches and Google glasses). In this embodiment, the electronic product is a mobile phone (or a tablet device) and includes a substrate 16 carrying semiconductor components and installed inside a device body of the electronic product (not shown). The substrate 16 is provided with at least one heat source 18 from which radiant heat is generated during activation of the electronic product.

The shell component 10 includes an outer shell body 12 and an outer heat-conducting sheet 14. The outer shell body 12 is combined with the device body of the electronic product and made of a low-thermal-conductivity material such as plastic or glass. The outer shell body 12 includes an inner surface 20 and an outer surface 22 opposite to the inner surface 20. The outer shell body 12 further includes at least one hole 24 penetrating the inner and outer surfaces 20 and 22. In this embodiment, the outer shell body 12 includes two spaced holes 24, and one of the holes 24 corresponds to the heat source 18. The outer heat-conducting sheet 14 is made of a high-thermal-conductivity material such as metal and combined with the outer shell body 12. The outer heat-conducting sheet 14 includes opposite inner and outer end faces 26 and 28. The inner end face 26 of the outer heat-conducting sheet 14 faces or corresponds to the heat source 18 of the electronic product. The outer heat-conducting sheet 14 further includes at least one heat-conducting portion 30 corresponding to the at least one hole 24. In this embodiment, the outer heat-conducting sheet 14 includes two spaced heat-conducting portions 30. Each heat-conducting portion 30 is composed of a convex portion protruding outward from the outer end face 28 and is embedded into a corresponding hole 24 in the outer shell body 12, so that each heat-conducting portion 30 is displayed on the outer surface 22 of the outer shell body 12, and the periphery edge of the heat-conducting portion 30 is encased in the thickness of the outer shell body 12. In this embodiment, each heat-conducting portion 30 has an outer side 32 which is flush with the outer surface 22 of the outer shell body 12, and each heat-conducting portion 30 is formed by recessing the inner end face 26 of the outer heat-conducting sheet 14. In a feasible embodiment, the outer side 32 of each heat-conducting portion 30 protrudes outside the outer surface 22 of the outer shell body 12 (not shown). The outer heat-conducting sheet 14 further includes a periphery 37 which is combined with the outer shell body 12 and surrounds the heat-conducting portion 30.

In this embodiment, the outer heat-conducting sheet 14 is fitted and encased in the outer shell body 12. Specifically, the outer shell body 12 is made of plastic, and the outer heat-conducting sheet 14 features a plurality of conic pinholes 36 therein. In manufacture, the outer heat-conducting sheet 14 is first placed inside a mold for manufacturing of the outer shell body 12. Then, the plurality of pinholes 36 are injected with plastic such that the heat-conducting portions 30 of the outer heat-conducting sheet 14 are embedded in the holes 24 of the outer shell body 12, and the periphery 37 of the outer heat-conducting sheet 14 is encased in the outer shell body 12 for integral combination. Thus, the periphery 37 of the outer heat-conducting sheet 14 is unitary with and connects the outer shell body 12.

Figure 5:
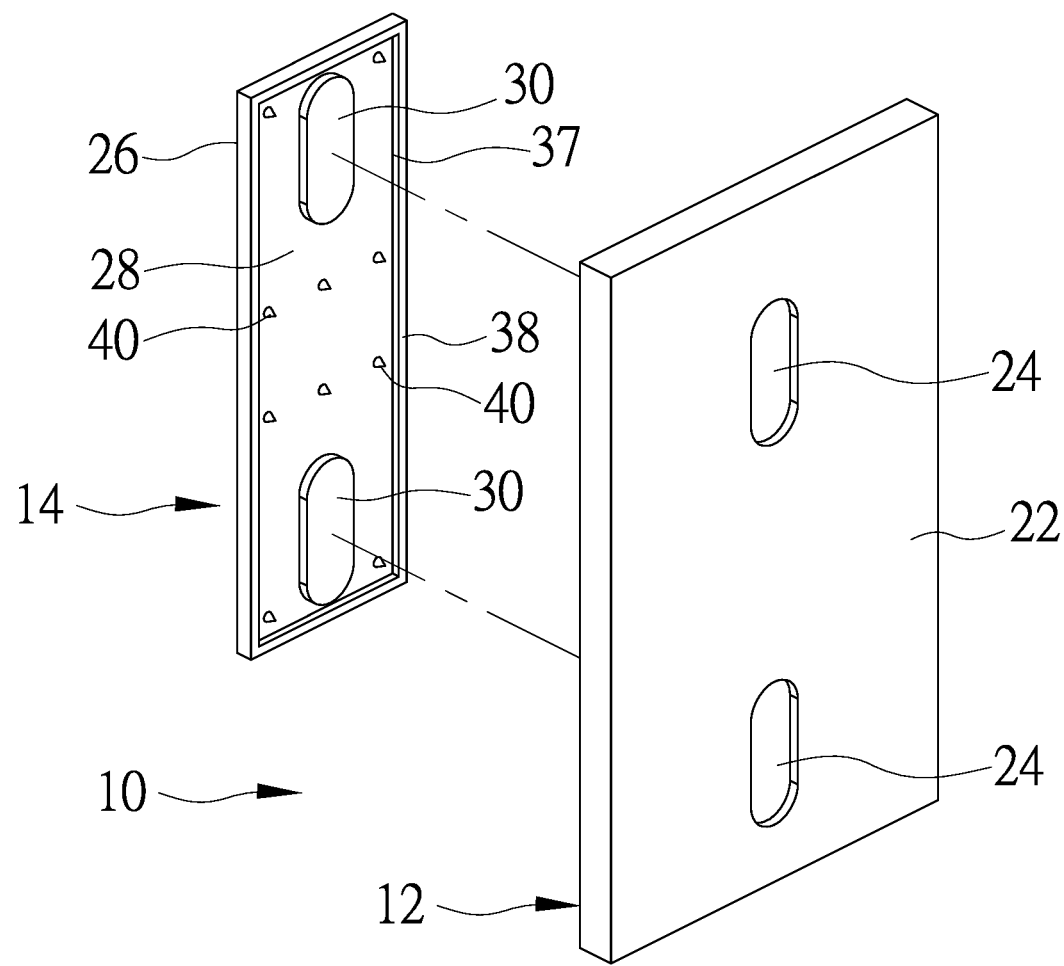
FIG. 5 is an exploded view of an electronics shell component according to a second embodiment of the present invention.
Figure 6:
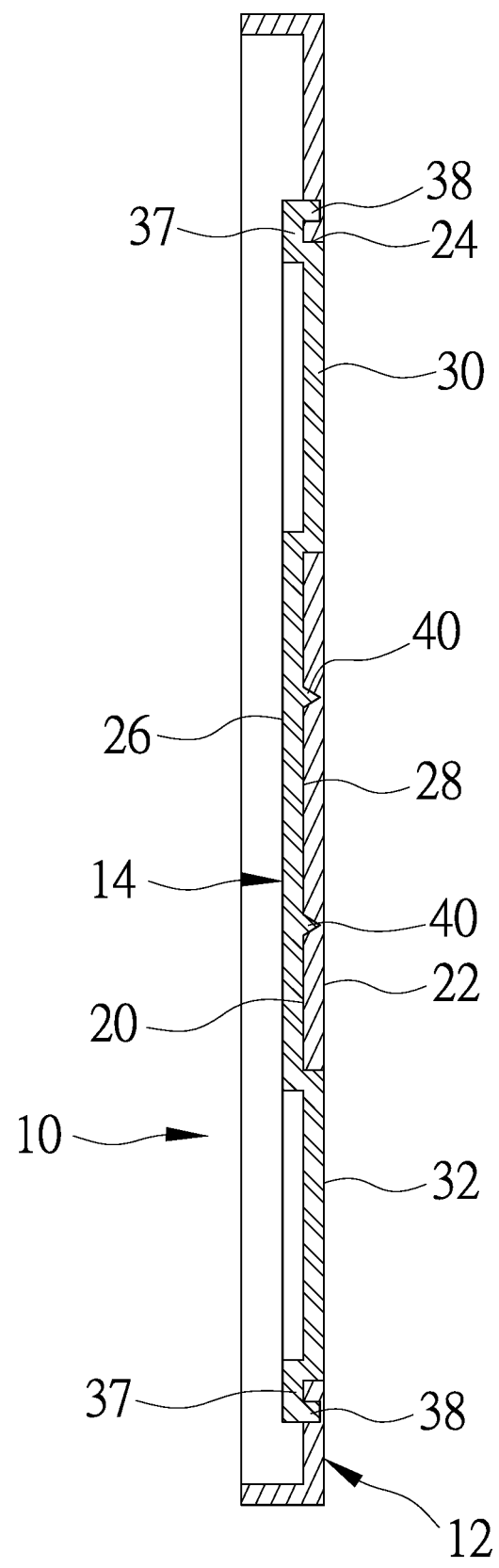
FIG. 6 is a sectional view of the shell component of FIG. 5.

In this embodiment of FIGS. 5 and 6, the outer heat-conducting sheet 14 is fused with the inner surface 20 of the outer shell body 12 made of plastic. Specifically, periphery 37 of the outer heat-conducting sheet 14 is provided with a flange 38, and the outer end face 28 of the outer heat-conducting sheet 14 is provided with a plurality of sharpened convex granules 40. In manufacture, the outer end face 28 of the outer heat-conducting sheet 14 faces the inner surface 20 of the outer shell body 12, and the heat-conducting portions 30 are fitted in the holes 24 of the outer shell body 12. The flange 38 and the convex granules 40 in the outer heat-conducting sheet 14 are melted down in a high-frequency melting process and fused with the outer shell body 12 for integral combination. In a feasible embodiment, the periphery 37 of the outer heat-conducting sheet 14 can extend to a circumference of the inner surface 20 of the outer shell body 12 for an expanded heat absorption/dissipation area.

Figure 7:
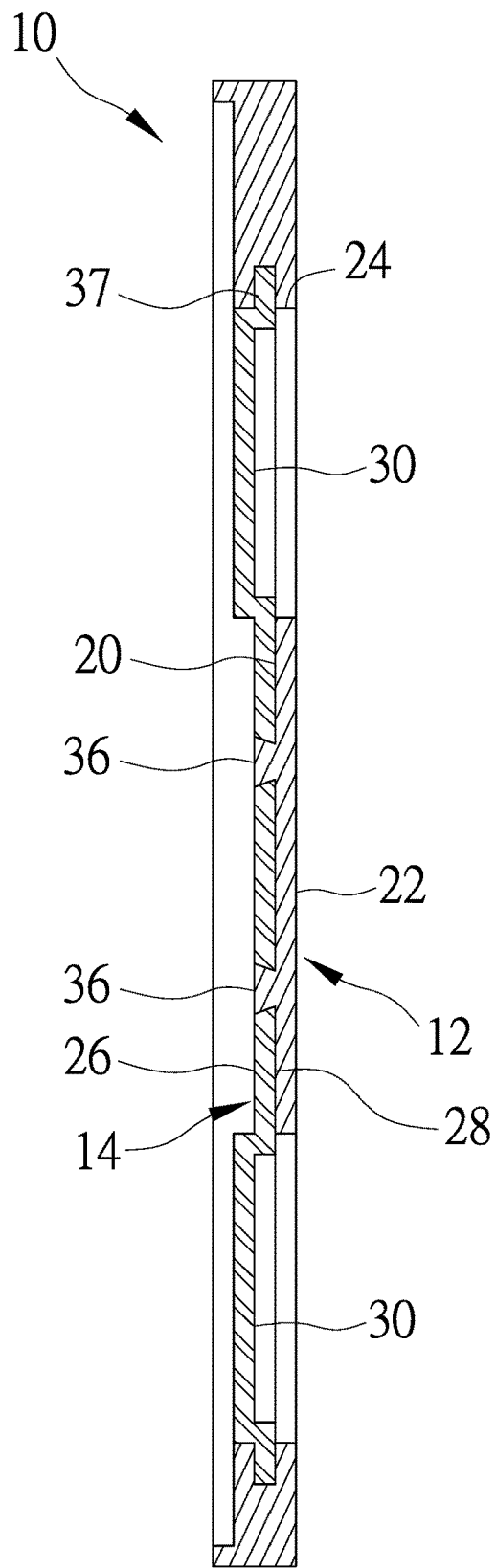
FIG. 7 is a sectional view similar to FIG. 3 illustrating a shell component according to a third embodiment of the present invention.
Figure 8:
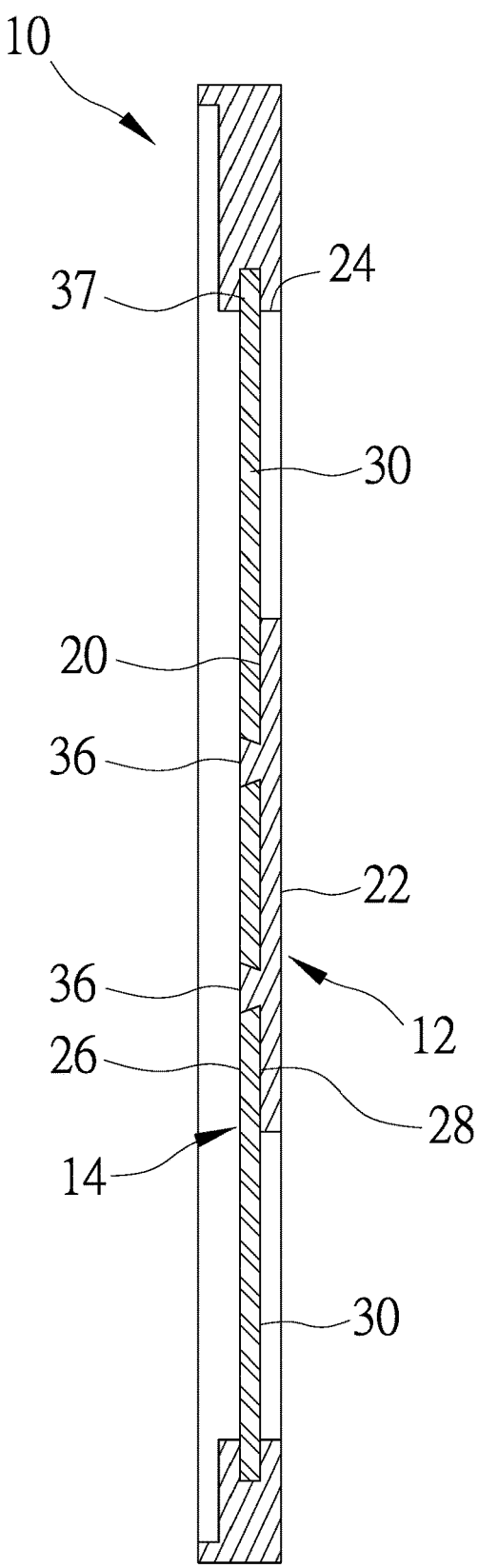
FIG. 8 is a sectional view similar to FIG. 3 illustrating a shell component according to a fourth embodiment of the present invention.

FIGS. 7 and 8 respectively illustrate two feasible embodiments of the shell component 10 of the present invention. In FIG. 7, each heat-conducting portion 30 corresponding to the hole 24 is composed of a convex portion protruding outward from the inner end face 26, so that the heat-conducting portion 30 can be closer to the heat source 18 or even contact the heat source 18. In FIG. 8, each heat-conducting portion 30 corresponding to the hole 24 is composed of a planar portion. In FIGS. 7 and 8, the outer heat-conducting sheet 14 is embedded into and encased in the outer shell body 12, so that the periphery 37 of the outer heat-conducting sheet 14 is wrapped by the outer shell body 12 for integral combination. In a feasible embodiment, the outer heat-conducting sheet 14 in FIGS. 7 and 8 is fused with the inner surface 20 of the outer shell body 12.

Figure 9:
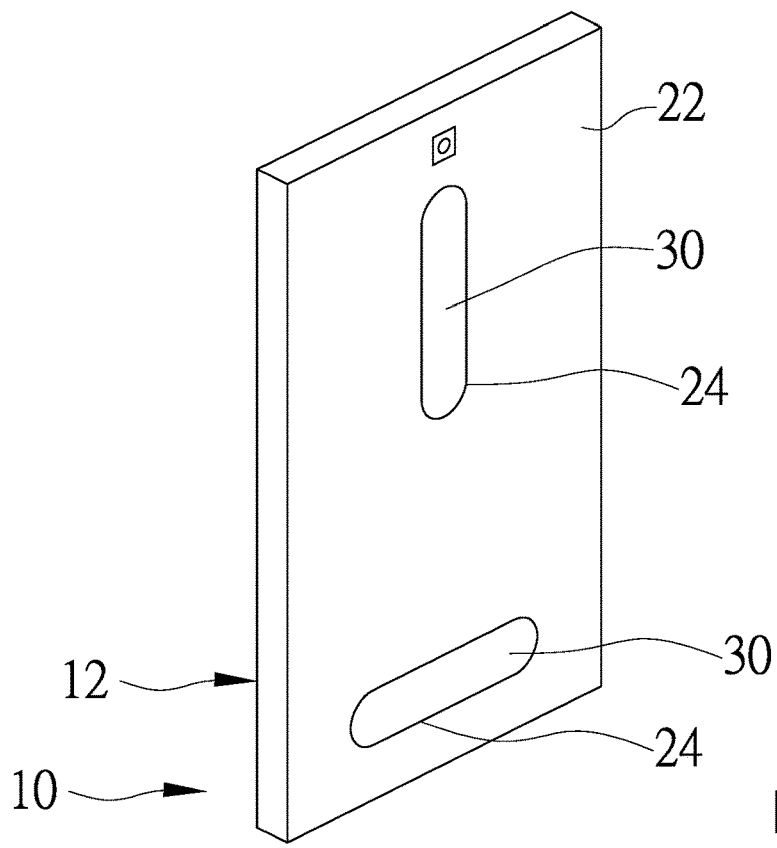
FIGS. 9 through 12 are schematic views of shell components from the fifth embodiment to the eighth embodiment of the present invention, respectively.
Figure 10:
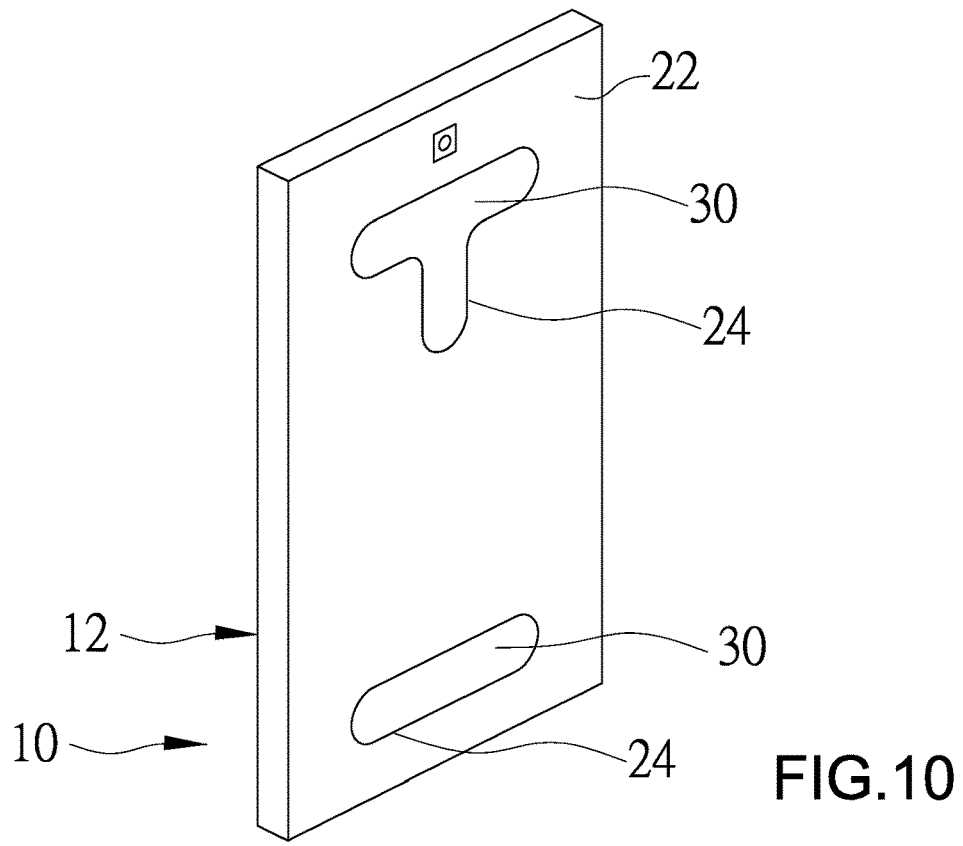
Figure 11:
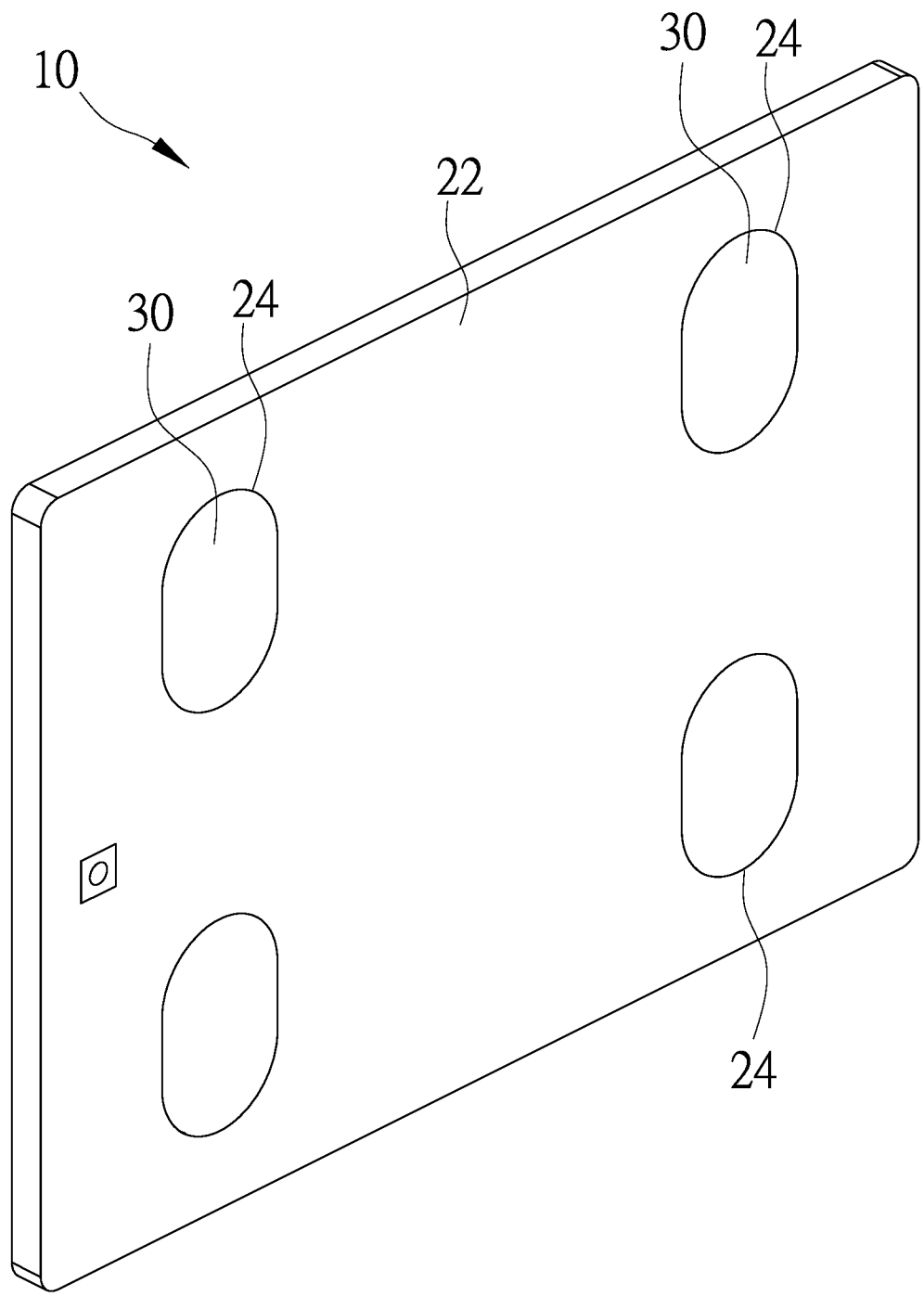
Figure 12:
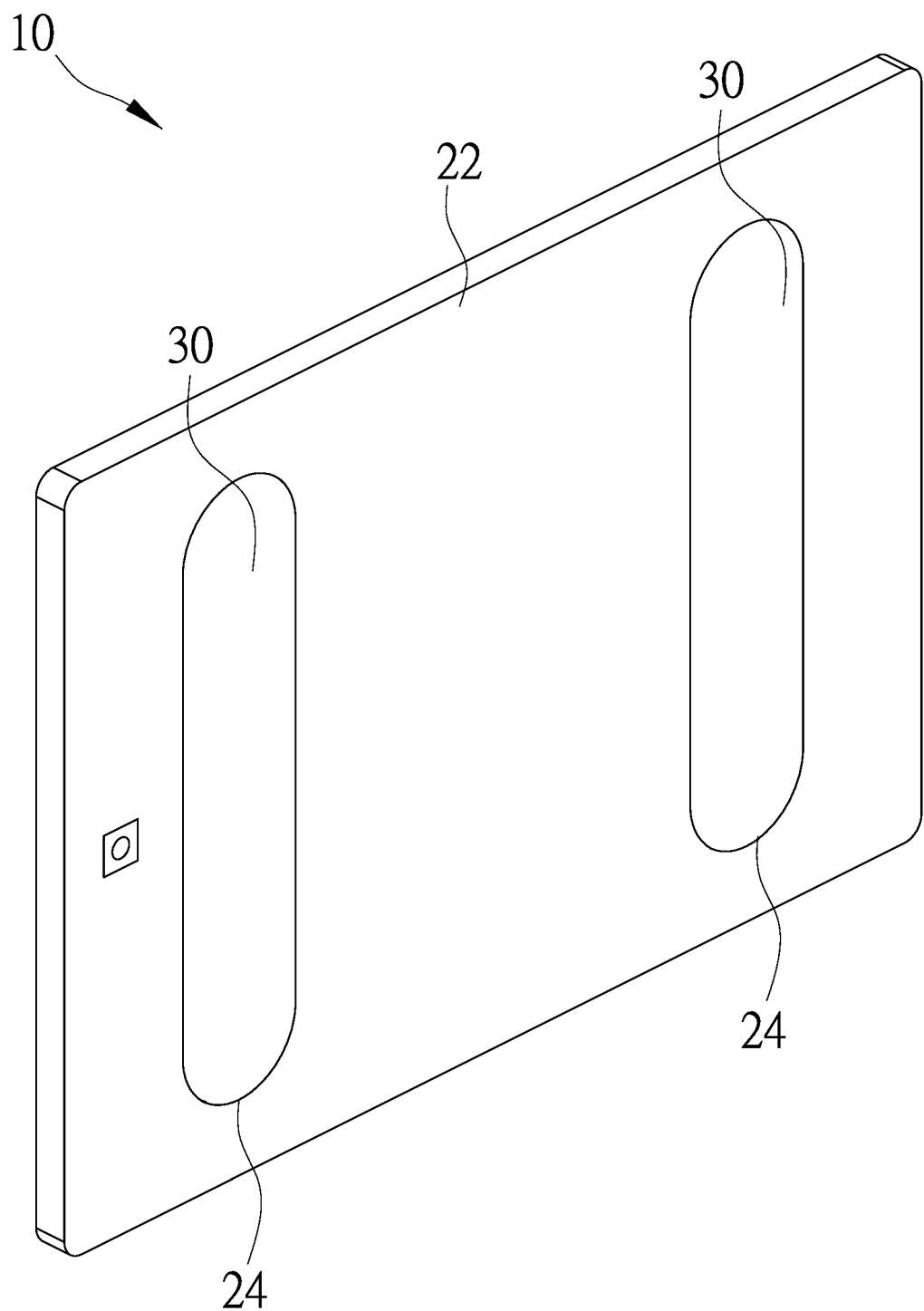

FIGS. 9 through 12 respectively illustrate four feasible embodiments of the shell component 10 of the present invention. The main difference between the four shell components 10 and the shell component 10 in the first embodiment lies in the shape, number, and arrangement positions of the holes 24 and the heat-conducting portions 30. FIG. 9 illustrates a longitudinal hole 24 and a transverse hole 24 opened in the upper side and the lower side of the outer shell body 12 for a mobile phone, respectively. FIG. 10 illustrates a T-shaped hole 24 and a transverse hole 24 opened in the upper side and the lower side of the outer shell body 12 for a mobile phone, respectively. FIG. 11 illustrates two elliptic holes 24 opened in each side of the outer shell body 12 for a tablet device. FIG. 12 illustrates a longitudinal hole 24 opened in each side of the outer shell body 12 for a tablet device. When a plurality of holes 24 are designed to be adjacent to sides or the periphery of the outer shell body 12, a user holing a mobile phone or a tablet device contacts the heat-conducting portions 30 by skin (fingers also) through which radiant heat generated by the heat source 18 is fast conducted.

Figure 13:
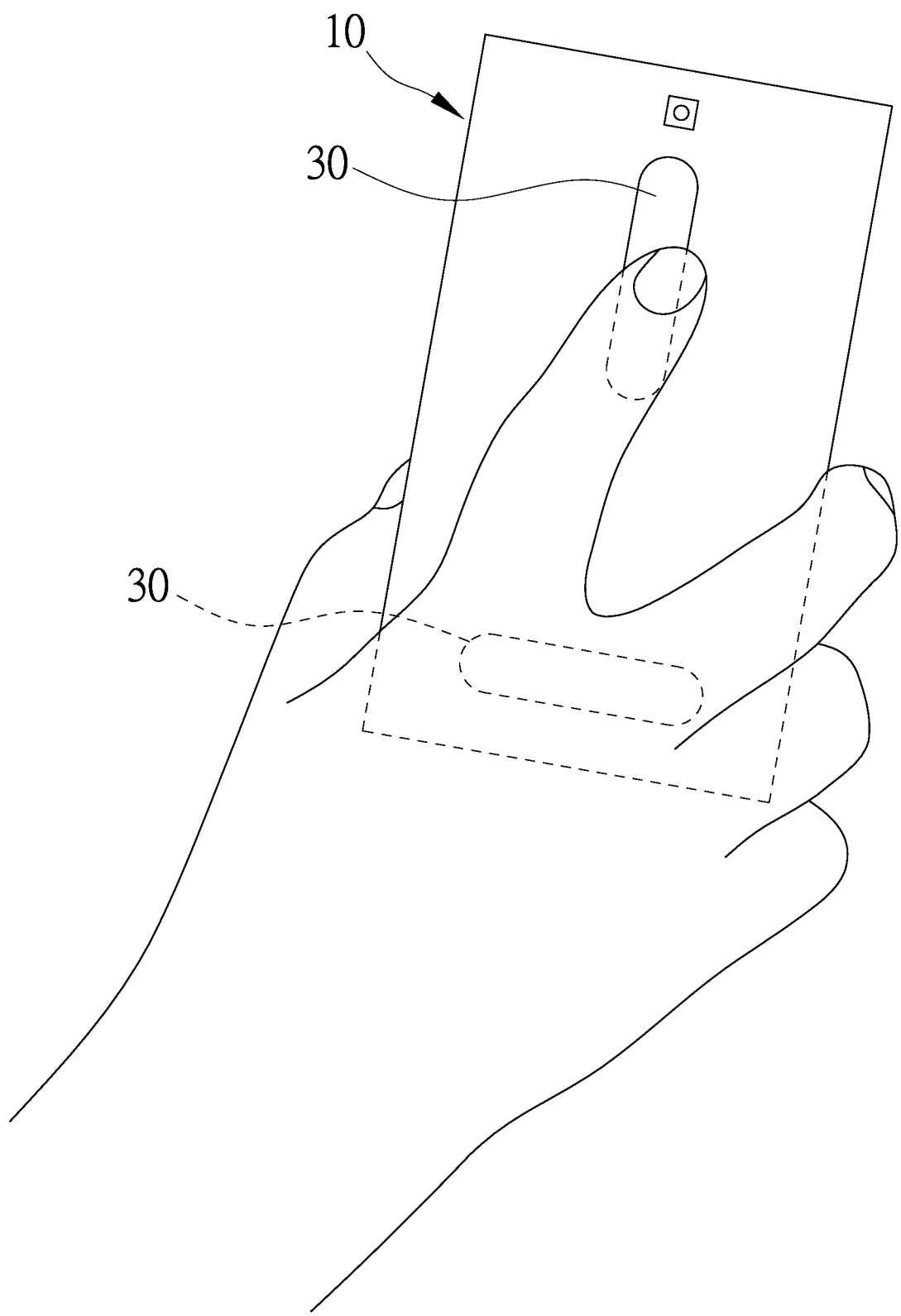
FIG. 13 is a schematic view illustrating a heat-conducting portion in FIG. 9 contacted by a user's fingers.
Figure 14:
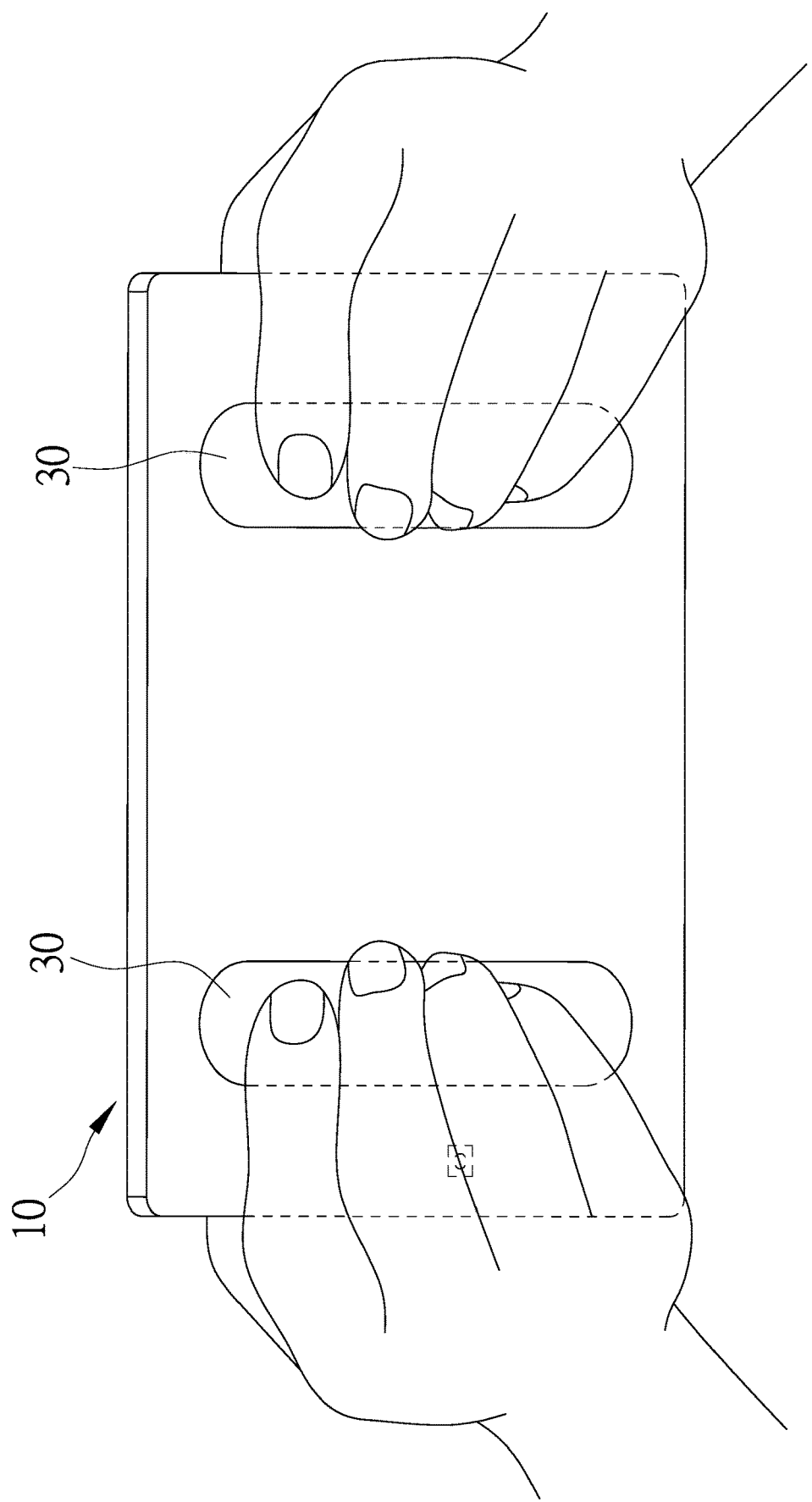
FIG. 14 is a schematic view illustrating a heat-conducting portion in FIG. 12 contacted by a user's fingers.

In practice, the shell component 10, which has the outer heat-conducting sheet 14 being adjacent to (or corresponding to) the heat source 18 and provided with the heat-conducting portions 30 in communication with the corresponding holes 24, allows radiant heat from the heat source 18 of airtight or semi-tight semiconductor components to be quickly absorbed by the outer heat-conducting sheet 14, uniformly distributed at other low-temperature airtight regions of electronics, and dissipated at ambient space outside the shell component 10 through the holes 24 fast. Moreover, when a user operates a mobile phone or a tablet device, the user's fingers holding the mobile phone or the tablet device can contact the heat-conducting portions 30 via the holes 24 (FIGS. 13 and 14), so that the heat-conducting portions 30 and the human body form a heat exchange effect to achieve fast heat conduction and dissipation, thereby preventing or delaying the heating of radiation inside the device body and allowing temperature inside the device body to be slightly higher than human body temperature. Specifically, a temperature rise attributed to the heat source 18 (for example, between 60 and 120° C.) can be reduced to a range from 38 to 40° C. through heat conduction of the heat-conducting portions 30 and biological temperature-control of the human body for normal operations of semiconductor components and controllable temperature inside the device body without damages of batteries due to high temperature. Moreover, the outer heat-conducting sheet 14 of the present invention can be processed for absorption of high radiant heat, fast heat conduction, fast heat dissipation, oxidation resistance, insulation and/or anti-static electricity without negative effects like oxidation and electromagnetic interference common in copper conductor tubes, copper conducting strips, copper-plated graphite rods or copper condenser tubes.

The shell component 10 of the present invention prevents semiconductor components inside a device body from high temperature and relies on biological temperature control of the human body for reverse heat conduction to inside of the device body, so that the electronic product kept at low-temperature status can be activated by biological temperature control. Specifically, an ordinary electronic product or a wearable device (for example, smart watch or smart glasses) kept at low-temperature status (below 10° C.) should be deactivated mandatorily for protecting a battery. In practice, the shell component 10 of the present invention allows biological temperature at a user's skin (fingers also) contacting the heat-conducting portions 30 through the holes 24 to be transmitted to inside of the electronic product for warming, activation and operation.

Figure 15:
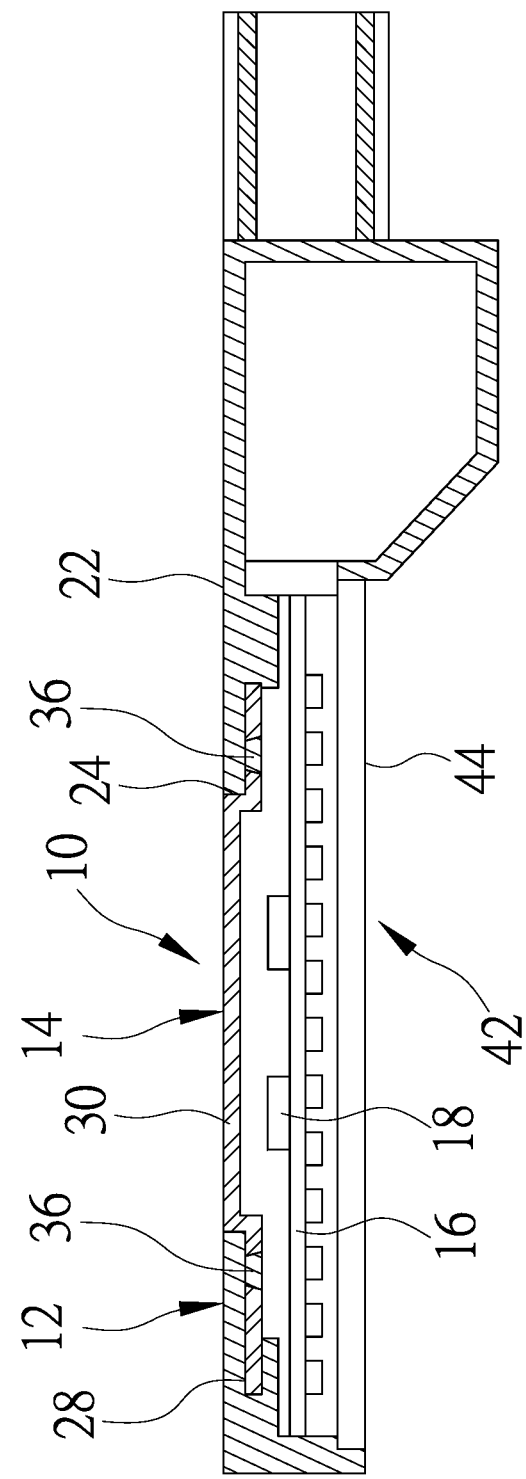
FIG. 15 is a schematic view of a shell component of the present invention used in a lamp.

FIG. 15 illustrates the shell component 10 in the ninth embodiment. In this embodiment, the electronic product is an LED lamp 42 which includes a device body 44, a shell component 10 combined with the device body 44, a substrate 16 inside the device body 44, and a plurality of heat sources 18 mounted on the substrate 16. The shell component 10 includes an outer shell body 12 mounted on the device body 44 and an outer heat-conducting sheet 14 engaged with the outer shell body 12. The outer shell body 12 has a hole 24 corresponding to the heat sources 18. The outer heat-conducting sheet 14 includes a heat-conducting portion 30 protruding outward from the outer end face 28. The heat-conducting portion 30 is embedded into the hole 24 and displayed on the outer surface 22 of the outer shell body 12. The periphery 37 of the outer heat-conducting sheet 14 is integrally encased in the outer shell body 12.

Figure 16:
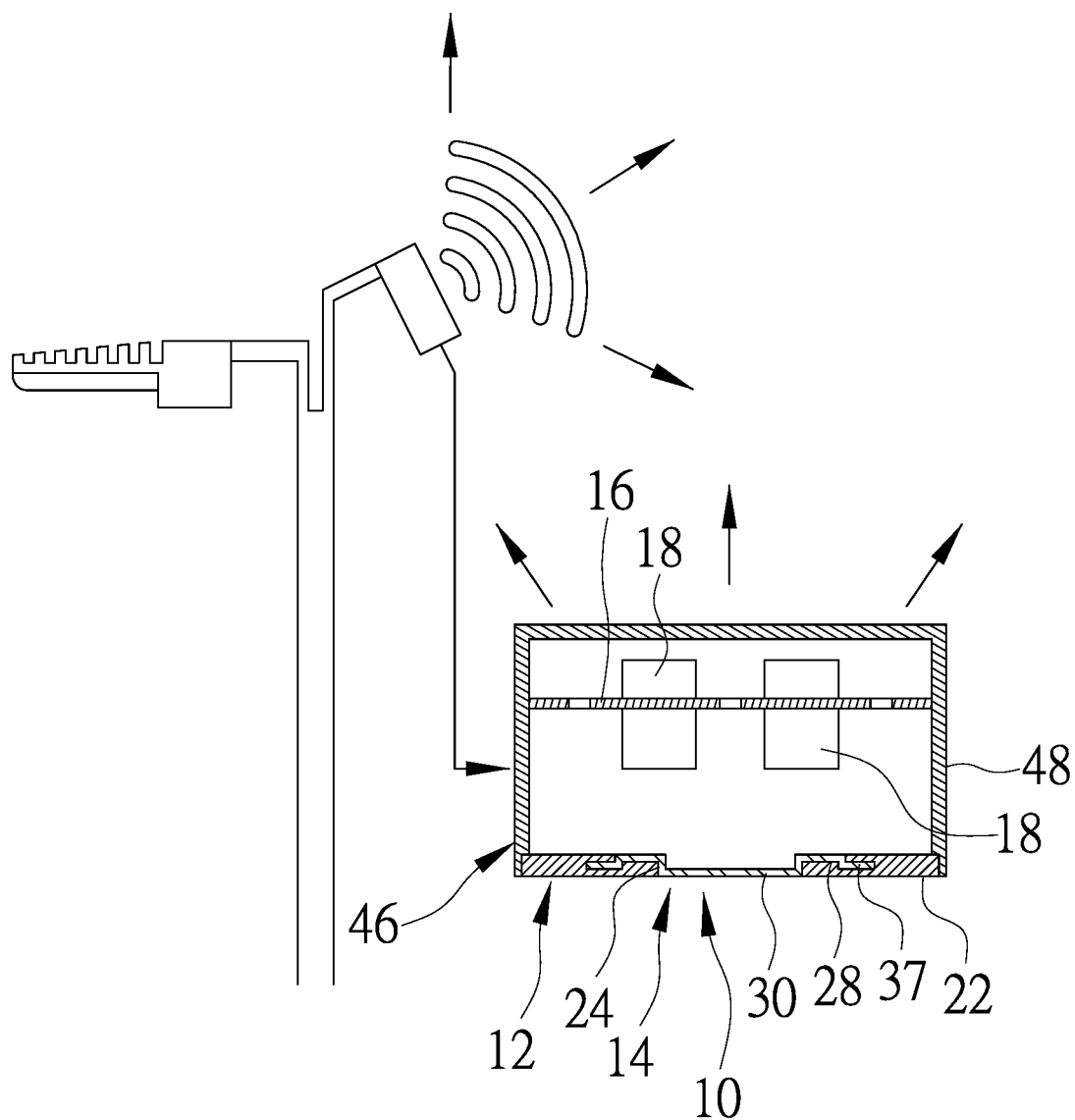
FIG. 16 is a schematic view of a shell component of the present invention used in a relay unit.

FIG. 16 illustrates the shell component 10 in the tenth embodiment. In this embodiment, the electronic product is a WiFi relay unit 46 which includes a device body 48 and a shell component 10 combined with the device body 48. The device body 48 accommodates a substrate 16 on which a plurality of heat sources 18 is mounted. The shell component 10 includes an outer shell body 12 and an outer heat-conducting sheet 14. The outer shell body 12 is combined with the device body 48 and has a hole 24 corresponding to the heat sources 18. The outer heat-conducting sheet 14 includes a heat-conducting portion 30 protruding outward from the outer end face 28. The heat-conducting portion 30 is embedded into the hole 24 and displayed on the outer surface 22 of the outer shell body 12.

Figure 17:
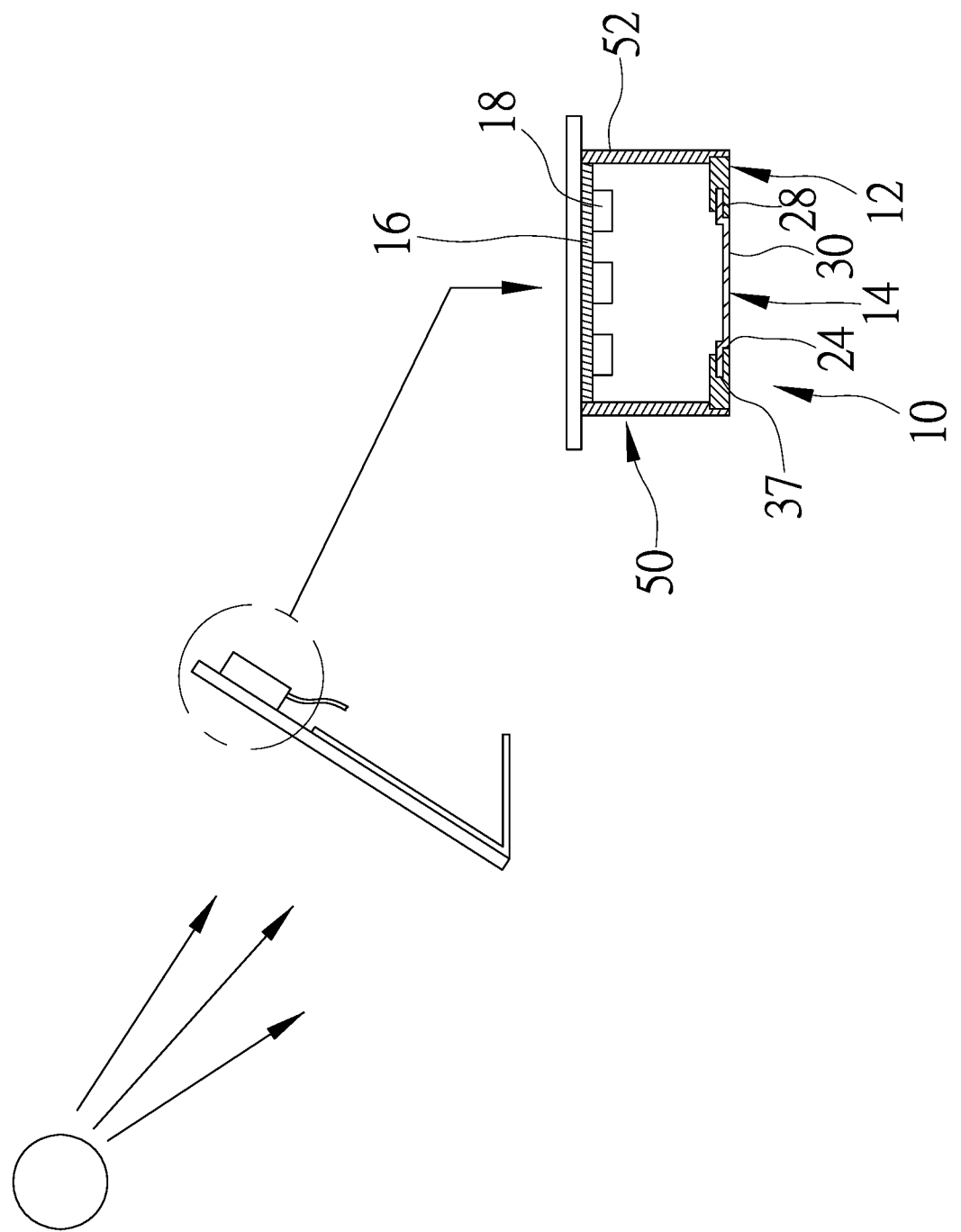
FIG. 17 is a schematic view of a shell component of the present invention used in a solar power connection box.

FIG. 17 illustrates the shell component 10 in the eleventh embodiment. In this embodiment, the electronic product is a solar power connection box 50 which includes a device body 52, a shell component 10 combined with the device body 52, a substrate 16 installed in the device body 52 and a plurality of heat sources 18 on the substrate 16. The shell component 10 includes an outer shell body 12 and an outer heat-conducting sheet 14. The outer shell body 12 is combined with the device body 52 and has a hole 24 corresponding to the heat sources 18. The outer heat-conducting sheet 14 includes a heat-conducting portion 30 protruding outward from the outer end face 28. The heat-conducting portion 30 is fitted in the hole 24 and displayed on the outer surface 22 of the outer shell body 12.

Figure 18:
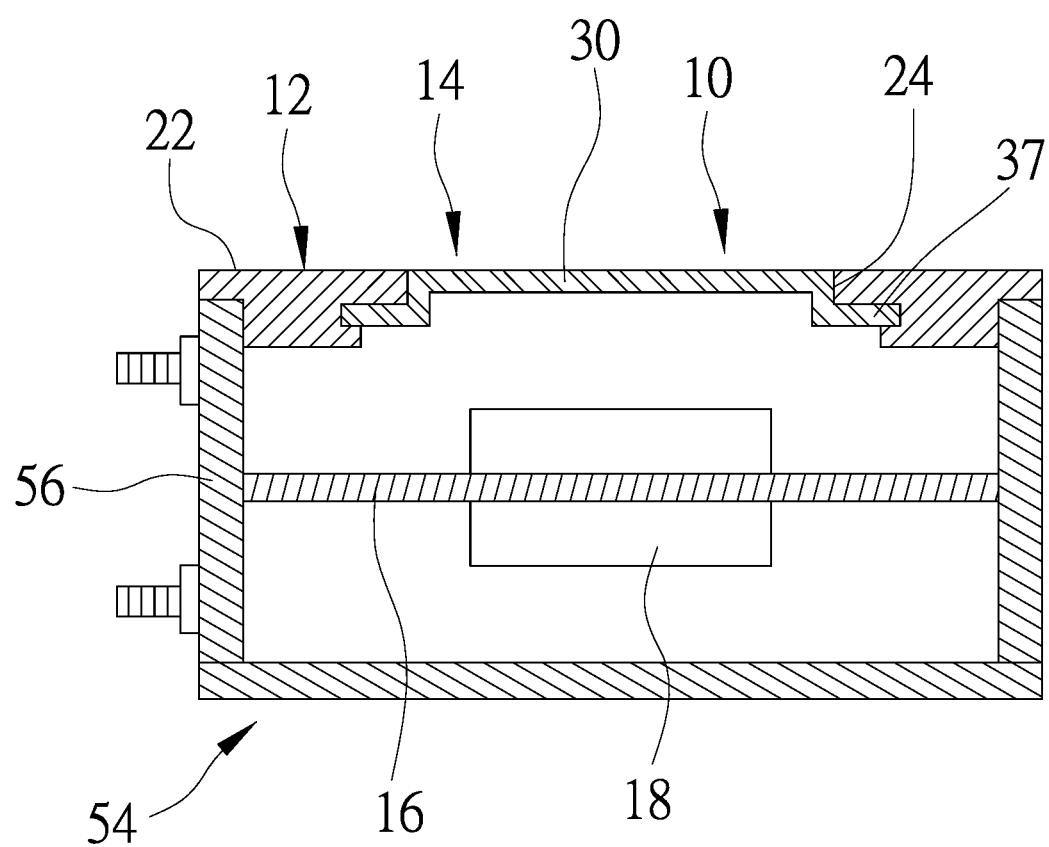
FIG. 18 is a schematic view of a shell component of the present invention used in an inverter.

FIG. 18 illustrates the shell component 10 in the twelfth embodiment. In this embodiment, the electronic product is a solar inverter 54 which includes a device body 56, a shell component 10 combined with the device body 56, a substrate 16 installed in the device body 56, and a heat source 18 on the substrate 16. The shell component 10 includes an outer shell body 12 and an outer heat-conducting sheet 14. The outer shell body 12 is combined with the device body 56 and has a hole 24 corresponding to the heat sources 18. The outer heat-conducting sheet 14 includes a heat-conducting portion 30 protruding outward from the outer end face 28. The heat-conducting portion 30 is embedded into the hole 24 and displayed on the outer surface 22 of the outer shell body 12. The periphery 37 of the outer heat-conducting sheet 14 is integrally encased in the outer shell body 12.

Figure 19:
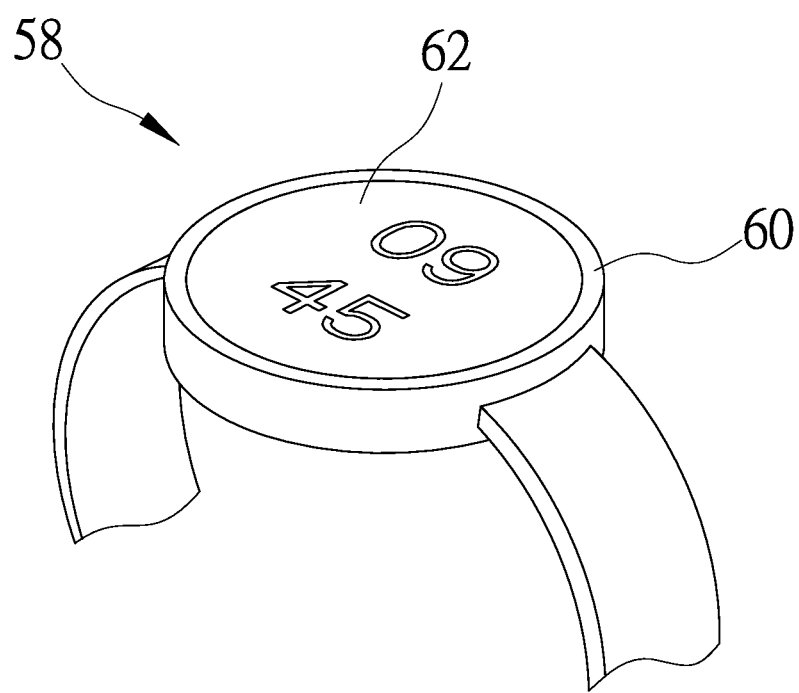
FIG. 19 is a schematic view of a shell component of the present invention used in a wearable device.
Figure 20:
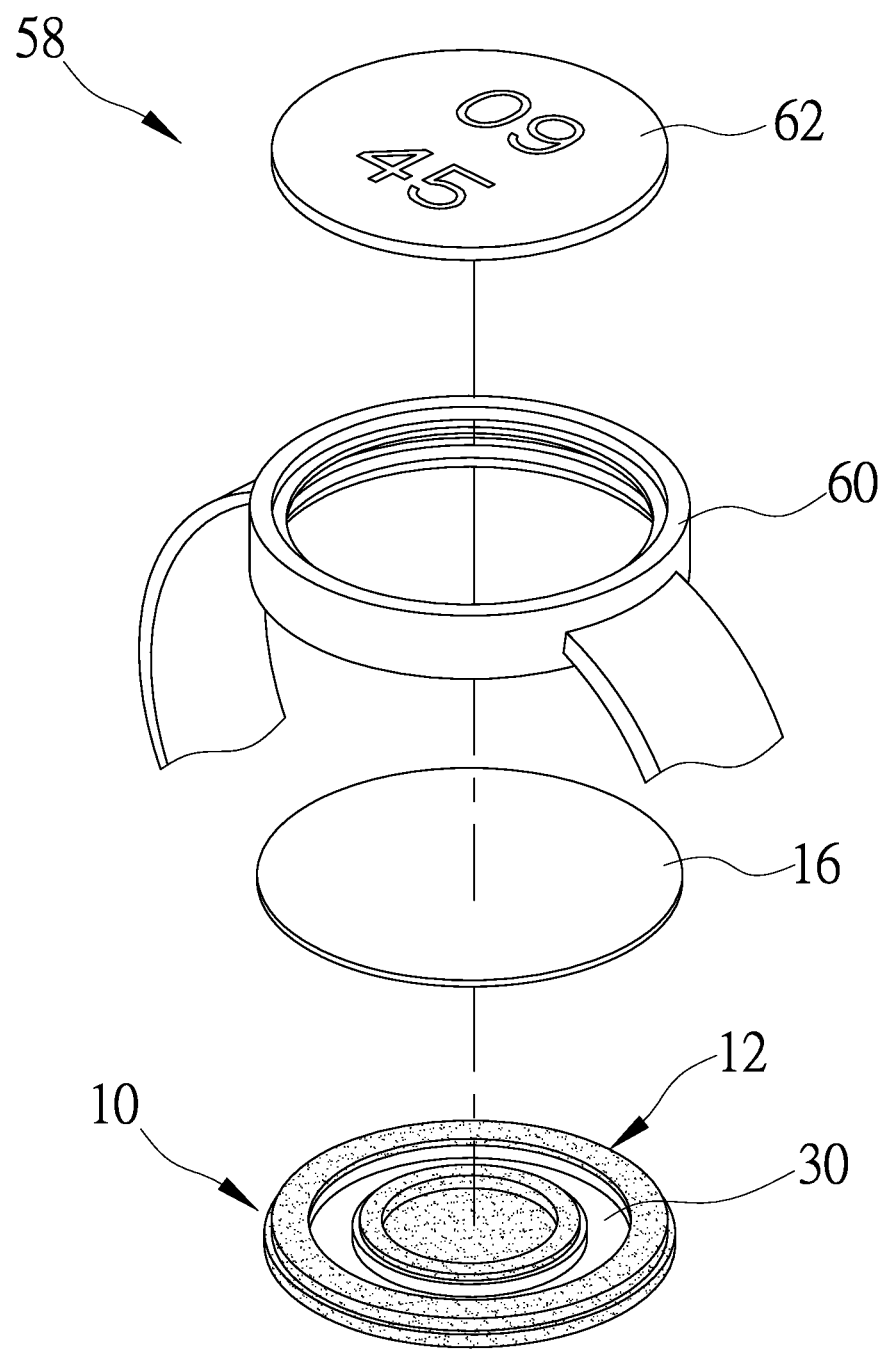
FIG. 20 is an exploded view of the wearable device in FIG. 19.
Figure 21:
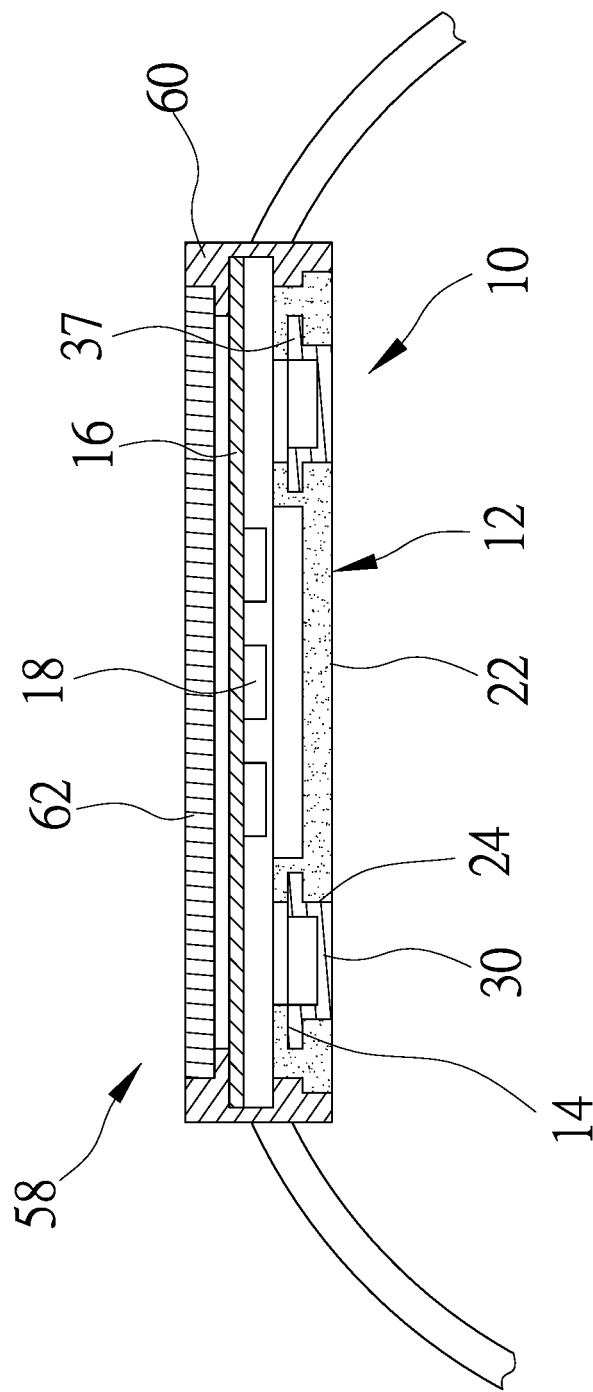
FIG. 21 is a sectional view of the wearable device in FIG. 19.

FIGS. 19 through 21 illustrate the shell component 10 in the thirteenth embodiment. In this embodiment, the electronic product is a smart watch (wearable device) 58, which includes a device body 60, a watch cover 62 engaged on the device body 60, a shell component 10, a substrate 16 installed in the device body 60, and a heat source 18 on the substrate 16. The shell component 10 includes an outer shell body 12 and an outer heat-conducting sheet 14. The outer shell body 12 is combined with the device body 60, and a ring hole 24 is opened in the outer shell body 12 and corresponds to the heat source 18. The outer heat-conducting sheet 14 includes a heat-conducting portion 30 protruding outward and being adjacent to the periphery 37 of the outer heat-conducting sheet 14. The heat-conducting portion 30 is embedded into the hole 24 and displayed on the outer surface 22 of the outer shell body 12. The periphery 37 of the outer heat-conducting sheet 14 is integrally encased in the outer shell body 12. When the smart watch 58 is worn on a user, the heat-conducting portion 30 contacts the user's skin through which radiant heat generated by the heat source 18 is fast conducted for effective heat dissipation based on biological temperature control of the human body.

Figure 22:
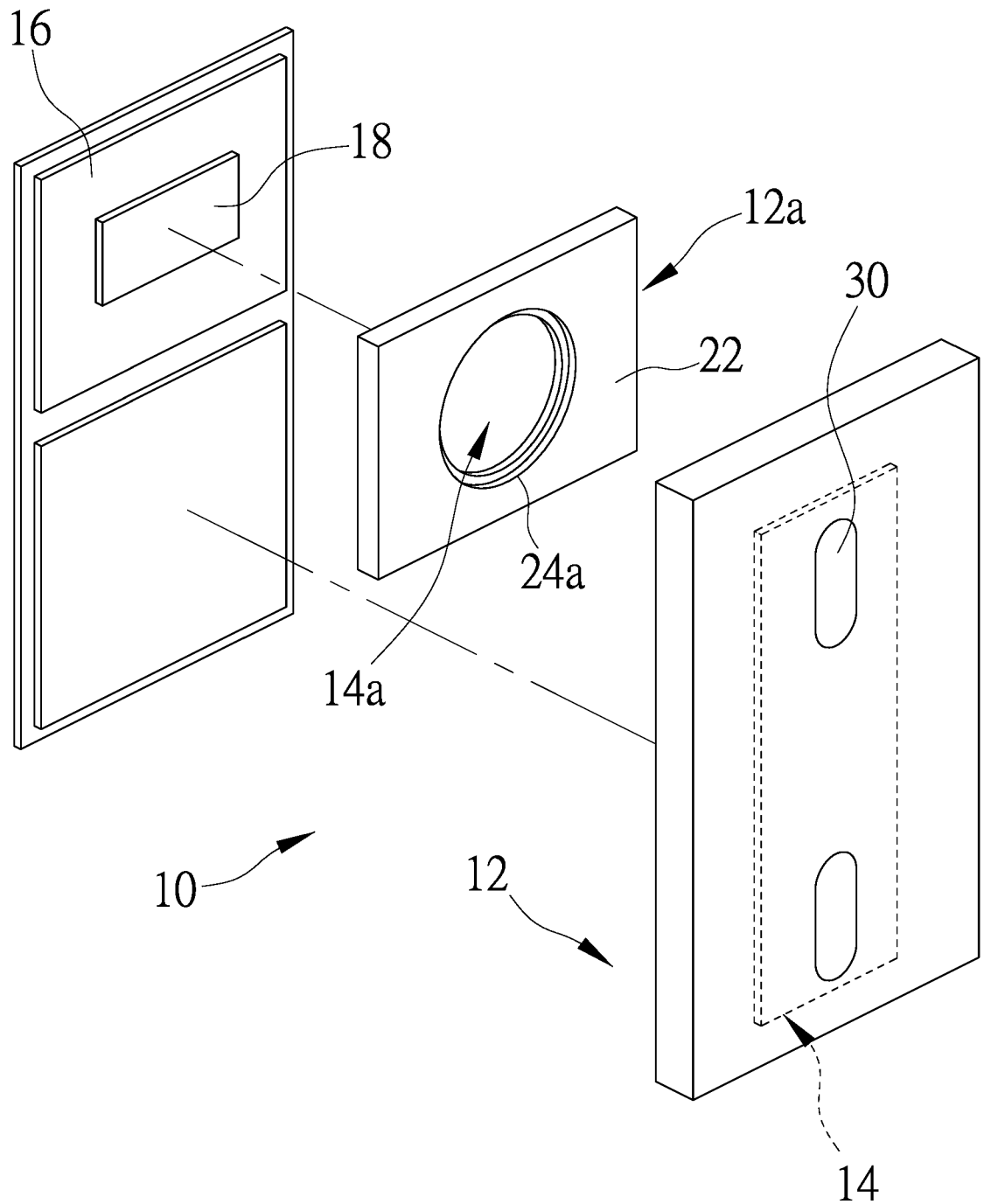
FIG. 22 is a schematic view of a shell component of the present invention used in a mobile phone.
Figure 23:
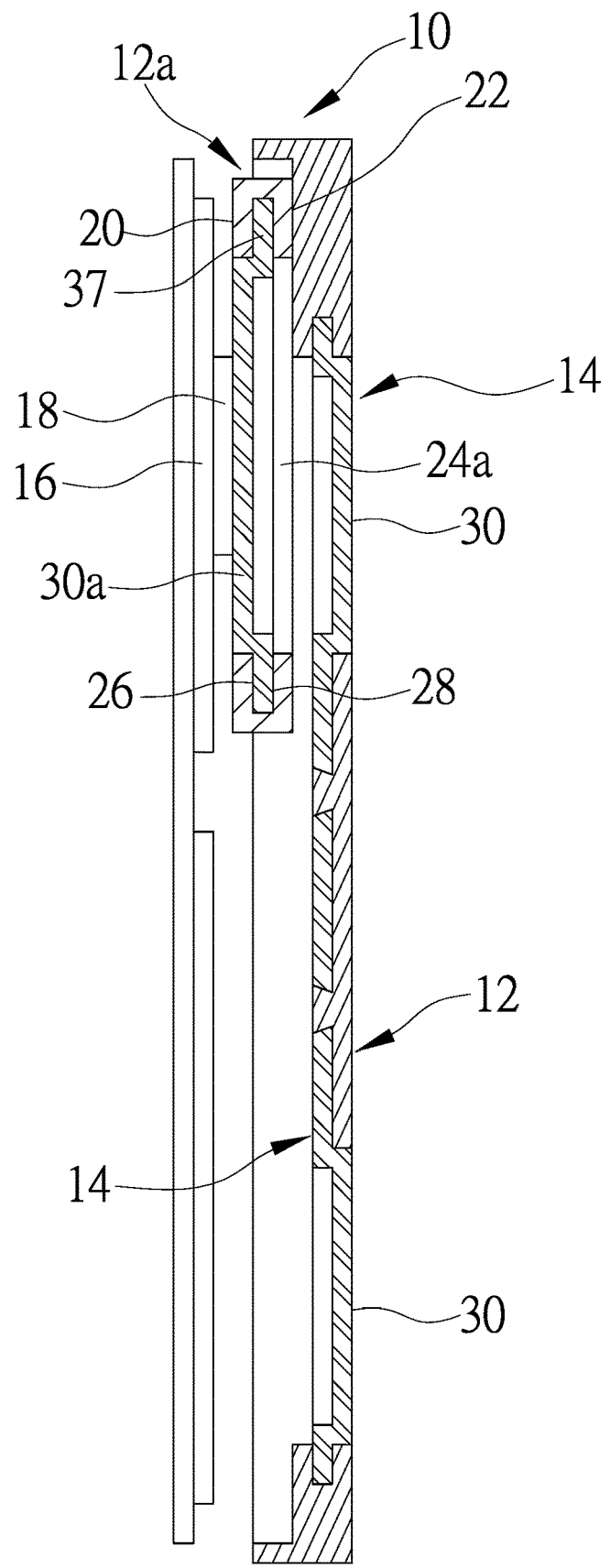
FIG. 23 is a sectional view of the electronic product in FIG. 22.

FIGS. 22 through 23 illustrate the shell component 10 in the fourteenth embodiment. In this embodiment, the shell component 10 includes an outer shell body 12 combined with a device body of an electronic product, an outer heat-conducting sheet 14 mounted on the outer shell body 12, a middle shell body 12a installed inside the device body of the electronic product, and an inner heat-conducting sheet 14a combined with the middle shell body 12a. The device body of the electronic product (not shown) accommodates a substrate 16 for semiconductor components and at least one heat source 18 on the substrate 16. The outer shell body 12 and the outer heat-conducting sheet 14 in the fourteenth embodiment are similar to the outer shell body 12 and the outer heat-conducting sheet 14 in FIG. 3 in structure and not explained hereinafter. The middle shell body 12a includes opposite inner and outer surfaces 20 and 22 and a hole 24a penetrating the inner and outer surfaces 20 and 22 (FIG. 24) and corresponding to the heat source 18 as well as the outer heat-conducting sheet 14. The inner heat-conducting sheet 14a includes opposite inner and outer end faces 26 and 28 and a heat-conducting portion 30a protruding outward from the inner end face 26. The heat-conducting portion 30a is adjacent to or corresponds to the heat source 18, and the heat-conducting portion 30a is embedded into the hole 24a of the middle shell body 12a. In this embodiment, each heat-conducting portion 30a is formed by recessing the outer end face 28 of the inner heat-conducting sheet 14a, and the periphery edge of the heat-conducting portion 30a is wrapped in the thickness of the middle shell body 12a.

In practice of the shell component 10 in FIGS. 22 and 23, the middle shell body 12a and the outer shell body 12 can be used to substitute the middle shell body and the outer shell body of an existing mobile phone directly without any modification inside the existing device body in structure. Moreover, the inner heat-conducting sheet 14a being adjacent to or corresponding to the heat source 18 and located between the outer heat-conducting sheet 14 and the heat source 18 quickly absorbs radiant heat generated by the heat source 18 of an airtight or semi-tight semiconductor component, so that heat is uniformly distributed at other low-temperature airtight regions of the electronic product and dissipated at ambient space outside the shell component 10 through the outer heat-conducting sheet 14 for fast conduction of radiant heat from the heat source 18. Furthermore, the fingers of a user who is operating a mobile phone or a tablet device contact the heat-conducting portions 30 of the outer heat-conducting sheet 14 for effective heat exchanges between the heat-conducting portions 30 and the human body and fast heat conduction and dissipation.

Figure 3:
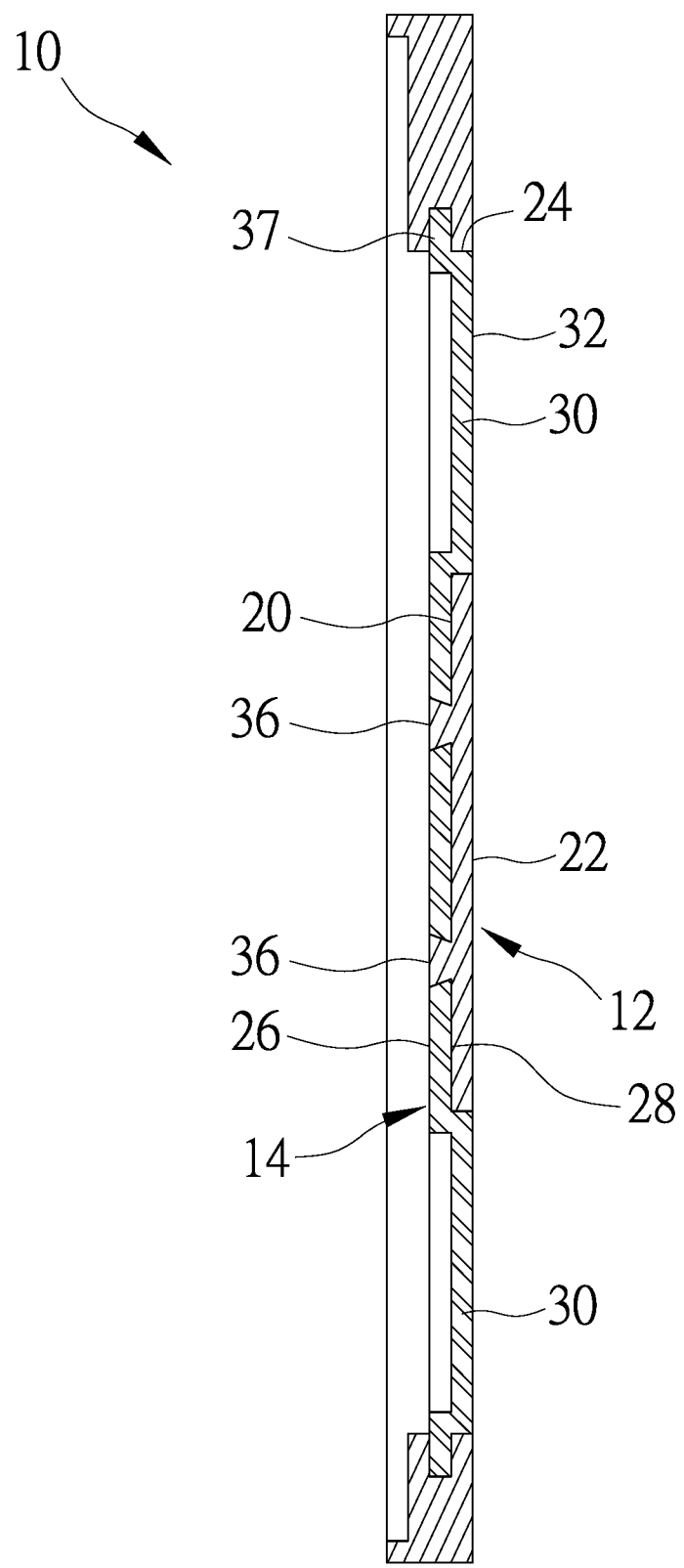
FIG. 3 is a sectional view of the shell component of FIG. 1.
Figure 4:
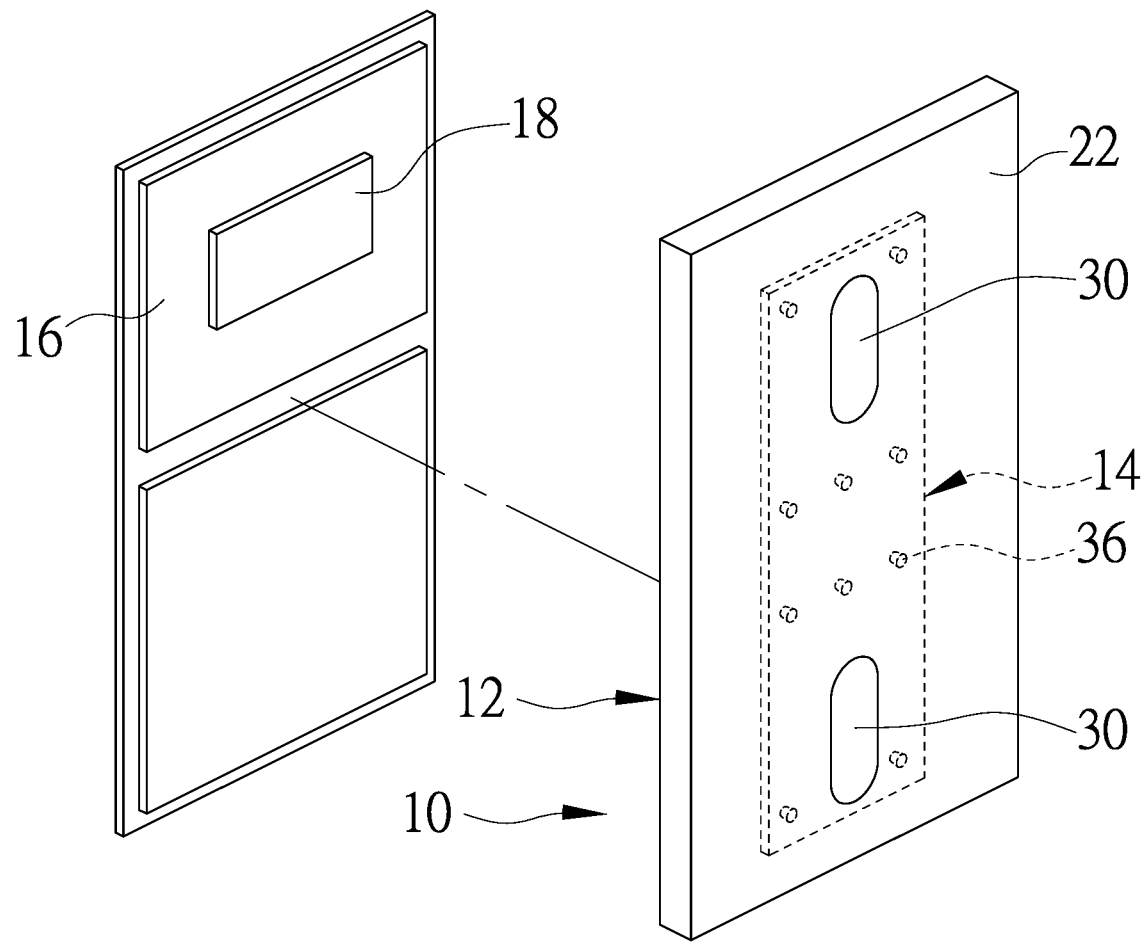
FIG. 4 is a schematic view of the shell component of FIG. 1 used in a mobile phone.
Figure 24:
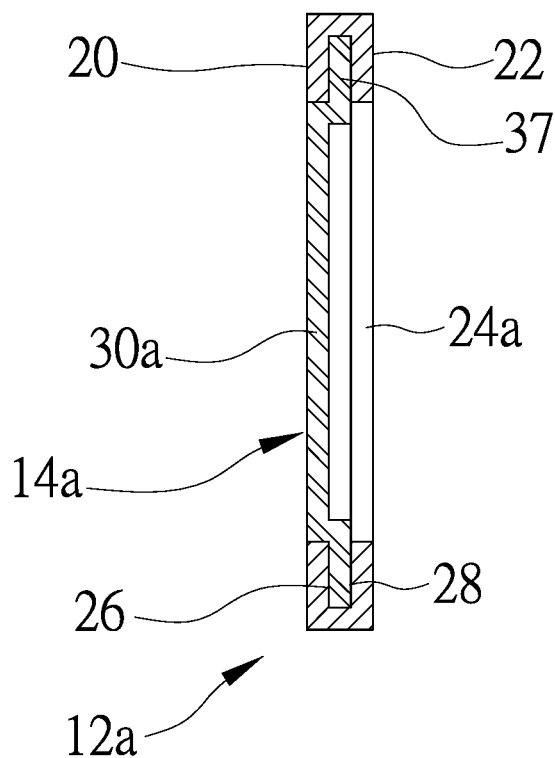
FIG. 24 is a sectional view of a middle shell body in FIG. 22.
Figure 25:
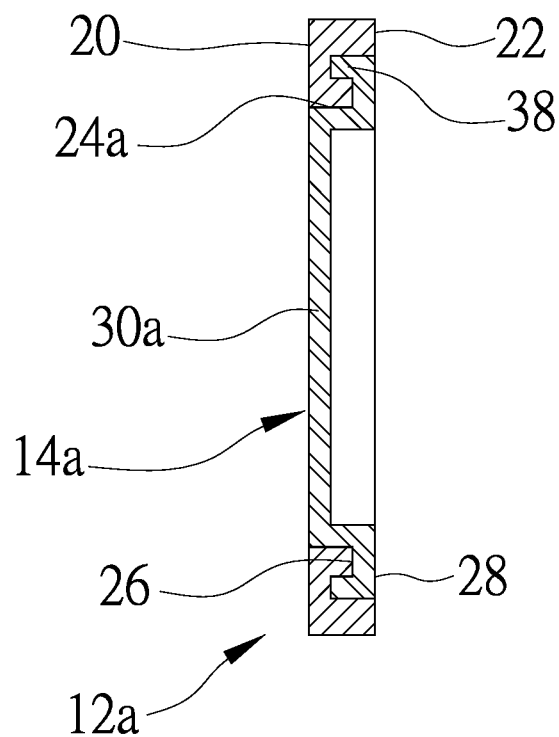
FIG. 25 is a sectional view similar to FIG. 24 illustrating the middle shell body according to another embodiment.

In the embodiment of FIG. 24, the inner heat-conducting sheet 14a is integrally fitted and covered in the middle shell body 12a (similar to the fitting and covering structure shown in FIG. 3). In the embodiment of FIG. 25, the inner heat-conducting sheet 14a is welded and joined to the middle shell body 12a to form an integrated structure (similar to the welded structure shown in FIG. 6).

The scope of the invention is to be indicated by the appended claims, rather than by the foregoing description, and all changes which come within the meaning and range of equivalency of the claims are intended to be embraced therein.

The invention claimed is:

1. A biologically temperature-controlled electronics shell component comprising:
    an outer shell body adapted to be combined with a device body of an electronic product, with the device body having a heat source therein, with the outer shell body including opposite inner and outer surfaces in a thickness direction and at least one hole penetrating the inner and outer surfaces in the thickness direction; and
    an outer heat-conducting sheet combined with the outer shell body and including opposite inner and outer end faces and at least one heat-conducting portion, with the inner end face of the outer heat-conducting sheet facing the heat source of the electronic product, wherein the at least one heat-conducting portion corresponds to each at least one hole in the outer shell body, so that the heat-conducting portion can be contacted by a user through the hole, wherein the outer heat-conducting sheet further includes a periphery surrounding each at least one heat-conducting portion and combined with the outer shell body, wherein the outer shell body is made of a plastic material, the outer heat-conducting sheet is made of a metal material, and each at least one heat-conducting portion is composed of a convex portion protruding outward from the outer end face in the thickness direction and has a periphery edge encased in each corresponding at least one hole of the outer shell body, wherein the outer heat-conducting sheet is displayed on the outer surface of the outer shell body only at the at least one heat-conducting portion in each corresponding at least one hole in the outer shell body.

2. The electronics shell component as claimed in claim 1, wherein the electronic product is one of a mobile phone, a tablet device, a laptop computer, a WiFi relay unit, a LED lamp, a solar power connection box, a solar inverter and a wearable device.

3. The electronics shell component as claimed in claim 1, wherein the outer heat-conducting sheet is provided with a plurality of pinholes in which plastic is injected such that the periphery of the outer heat-conducting sheet is encased in the outer shell body for integral combination.

4. The electronics shell component as claimed in claim 1, wherein the periphery of the outer heat-conducting sheet is provided with a flange, and the outer end face of the outer heat-conducting sheet is provided with a plurality of sharpened convex granules, with the flange and the convex granules of the outer heat-conducting sheet being fused with the outer shell body such that the outer heat-conducting sheet is fused with the inner surface of the outer shell body.

5. The electronics shell component as claimed in claim 1, wherein the at least one hole includes a plurality of holes arranged adjacent to sides of the outer shell body, with the periphery of the outer heat-conducting sheet extending to a circumference of the inner surface of the outer shell body.

6. The electronics shell component as claimed in claim 1, further comprising:
    a middle shell body installed inside the device body of the electronic product and including opposite inner and outer surfaces and a hole penetrating the inner and outer surfaces of the middle shell body; and
    an inner heat-conducting sheet combined with the middle shell body and corresponding to the heat source, with the inner heat-conducting sheet located between the outer heat-conducting sheet and the heat source and including a heat-conducting portion corresponding to the hole of the middle shell body, with the inner heat-conducting sheet further including a periphery surrounding the heat-conducting portion of the inner heat-conducting sheet and engaged with the middle shell body.

7. The electronics shell component as claimed in claim 6, wherein the inner heat-conducting sheet includes opposite inner and outer end faces, and the heat-conducting portion of the inner heat-conducting sheet protrudes outward from the inner end face of the inner heat-conducting sheet.

\* \* \* \* \*